US008847348B2

United States Patent
Cai et al.

(10) Patent No.: US 8,847,348 B2
(45) Date of Patent: *Sep. 30, 2014

(54) COMPLEMENTARY BIPOLAR INVERTER

(71) Applicant: International Business Machines Corporation, Armonk, NY (US)

(72) Inventors: Jin Cai, Cortlandt Manor, NY (US); Robert H. Dennard, Croton-on-Hudson, NY (US); Wilfried E. Haensch, Somers, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/949,219

(22) Filed: Jul. 23, 2013

(65) Prior Publication Data

US 2014/0008758 A1     Jan. 9, 2014

Related U.S. Application Data

(63) Continuation of application No. 13/158,419, filed on Jun. 12, 2011, now Pat. No. 8,531,001.

(51) Int. Cl.
   *H01L 21/70*                (2006.01)
   *H01L 27/12*                (2006.01)
   *H01L 21/8228*             (2006.01)
   *H01L 21/84*                (2006.01)
   *H01L 27/082*              (2006.01)

(52) U.S. Cl.
   CPC ........ *H01L 27/1203* (2013.01); *H01L 21/8228* (2013.01); *H01L 21/84* (2013.01); *H01L 27/082* (2013.01)
   USPC ............ 257/526; 257/E21.611; 257/E27.053; 438/311

(58) Field of Classification Search
   CPC . H01L 21/8228; H01L 21/84; H01L 27/1203; H01L 27/082
   USPC ............ 257/526, E21.611, E27.053; 438/311
   See application file for complete search history.

(56) References Cited

U.S. PATENT DOCUMENTS 3,197,710 A     7/1965   Lin ................................ 330/307

(Continued)

OTHER PUBLICATIONS

U.S. Appl. No. 12/958,647, filed Dec. 2, 2010 (not yet published).

(Continued)

*Primary Examiner* — Trung Q Dang
(74) *Attorney, Agent, or Firm* — Ido Tuchman; Vazken Alexanian

(57) ABSTRACT

An example embodiment is a complementary transistor inverter circuit. The circuit includes a semiconductor-on-insulator (SOI) substrate, a lateral PNP bipolar transistor fabricated on the SOI substrate, and a lateral NPN bipolar transistor fabricated on the SOI substrate. The lateral PNP bipolar transistor includes a PNP base, a PNP emitter, and a PNP collector. The lateral NPN bipolar transistor includes a NPN base, a NPN emitter, and a NPN collector. The PNP base, the PNP emitter, the PNP collector, the NPN base, the NPN emitter, and the NPN collector abut the buried insulator of the SOI substrate.

15 Claims, 5 Drawing Sheets

(56) References Cited

U.S. PATENT DOCUMENTS

| | | | | |
|---|---|---|---|---|
| 4,999,518 | A | 3/1991 | Dhong et al. | 326/109 |
| 5,013,936 | A | 5/1991 | Shiomi et al. | |
| 5,298,786 | A | 3/1994 | Shahidi et al. | 257/559 |
| 5,583,059 | A | 12/1996 | Burghartz | 438/319 |
| 6,274,894 | B1 | 8/2001 | Wieczorek et al. | |
| 6,340,612 | B1 | 1/2002 | Noble et al. | 438/213 |
| 6,812,545 | B2 | 11/2004 | Dunn et al. | 257/565 |
| 6,972,466 | B1 | 12/2005 | Liang et al. | |
| 8,531,001 | B2 * | 9/2013 | Cai et al. | 257/526 |
| 2004/0222436 | A1 | 11/2004 | Joseph et al. | |
| 2007/0096219 | A1 * | 5/2007 | Akino | 257/370 |

OTHER PUBLICATIONS

T. C. Chen et al., "Lateral Bipolar Transistor With Elevated Base Contact.," IBM Tech. Discl. Bull., Nov. 1989, pp. 157-159.

S. Parke et al., "A Versatile, SOI BiCMOS Technology with Complementary Lateral BJT's," IEDM, 1992, pp. 453-456.

M. Rodder, et al., "Silicon-on-Insulator Bipolar Transistors," IEEE Electron Device Letters, vol. EDL-4, No. 6, 1983, pp. 193-195.

J. C. Sturm, et al., "A Lateral Silicon-on-Insulator Bipolar Transistor with a Self-Aligned Base Contact," IEEE Electron Device Letters, vol. EDL-8, No. 3, 1987, pp. 104-106.

International Search Report and Written Opinion, PCT Application No. PCT/US2012/033713, p. 1-11 (Jul. 23, 2012).

* cited by examiner

COMPLEMENTARY BIPOLAR INVERTER

CROSS-REFERENCE TO RELATED APPLICATIONS

This application is a continuation of and claims priority under 35 U.S.C. §120 to U.S. patent application Ser. No. 13/158,419 filed on Jun. 12, 2011, the entire text of which is specifically incorporated by reference herein.

BACKGROUND

The present invention is directed toward semiconductor circuits, and more particularly to complementary bipolar inverter circuits and methods for fabrication such circuits.

Digital logic has been dominated by silicon CMOS circuits. It's desirable to reduce the operating voltage for CMOS circuits due to increased power consumption and heating in scaled CMOS technologies. However, CMOS performance is reaching a limit due to its poor signal-to-noise margins at low operating voltages (i.e., less than 0.5 volts).

In a bipolar inverter circuit, the output current is exponentially dependent on the input voltage, giving much higher transconductance and potentially faster switching speed than CMOS. However, conventional vertical bipolar transistors are generally not suitable for high density digital logic because of their large footprint due to isolation structure, their large parasitic capacitance due to the relatively large base-collector junction area, and associated minority carrier charge storage when biased in the saturation mode, that is when the collector-base diode is forward biased.

SUMMARY

In one aspect, the present invention provides a complementary transistor inverter circuit. The circuit includes a semiconductor-on-insulator (SOI) substrate, a lateral PNP bipolar transistor fabricated on the SOI substrate, and a lateral NPN bipolar transistor fabricated on the SOI substrate. The lateral PNP bipolar transistor includes a PNP base, a PNP emitter, and a PNP collector. The lateral NPN bipolar transistor includes a NPN base, a NPN emitter, and a NPN collector.

In another aspect, the present invention provides a method for fabricating a complementary transistor inverter circuit. The method includes fabricating a lateral PNP transistor on a silicon-on-insulator substrate. The lateral PNP bipolar transistor includes a PNP base, a PNP emitter, and a PNP collector. Another fabricating step forms a lateral NPN transistor on the silicon-on-insulator substrate. The lateral NPN bipolar transistor includes a NPN base, a NPN emitter, and a NPN collector. Next, the lateral PNP transistor and the lateral NPN transistor are electrically coupled to form an inverter. The base of the PNP and the base of the NPN are electrically connected to form the input of the inverter, and the collector of the PNP and the collector of the NPN are electrically connected to form the output of the inverter.

DETAILED DESCRIPTION

Figure 1:
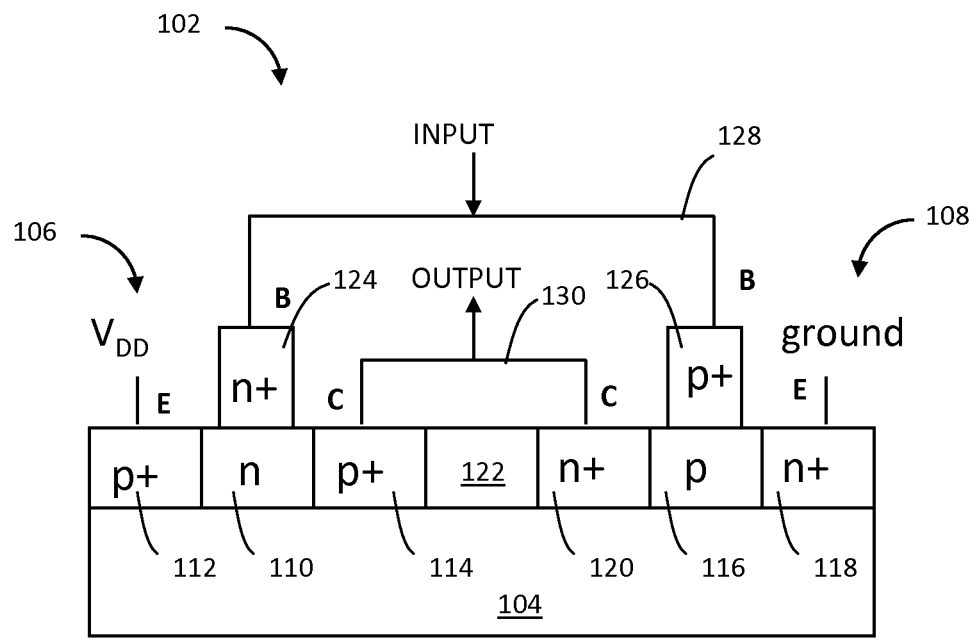
FIG. 1 shows an example embodiment of a complementary transistor inverter circuit contemplated by the present invention.

The present invention is described with reference to embodiments of the invention. Throughout the description of the invention reference is made to FIGS. 1-5. When referring to the figures, like structures and elements shown throughout are indicated with like reference numerals.

FIG. 1 shows an example embodiment of a complementary transistor inverter circuit 102 contemplated by the present invention. The inverter circuit 102 includes a semiconductor-on-insulator (SOI) substrate. In a particular embodiment, the SOI wafer used has a silicon thickness between 10 nm to 100 nm, and a buried insulator thickness between 20 nm to 200 nm. The inverter circuit 102 further includes a lateral PNP bipolar transistor 106 and a lateral NPN bipolar transistor 108 fabricated on the silicon layer located on the buried oxide layer 104. The buried oxide layer 104 is located on a substrate which is not shown. The lateral PNP bipolar transistor 106 and the NPN bipolar transistor 108 may be separated by a shallow insulation trench 122 made from dielectric material.

The lateral PNP bipolar transistor 106 includes a PNP base 110 between a PNP emitter 112 and a PNP collector 114. The PNP base 110 is an n-type semiconductor region and the PNP emitter 112 and the PNP collector 114 are heavily-doped p-type semiconductor regions separated by the PNP base 110. As used herein, heavy doping means introducing more than one dopant atom per one-hundred thousand atoms of silicon. The lateral PNP bipolar transistor 106 also includes a PNP extrinsic base region 124 abutting the PNP base 110. The PNP extrinsic base region 124 is a heavily-doped n-type semiconductor region. Furthermore, the PNP base, the PNP emitter, and the PNP collector abut the SOI buried oxide 104.

The lateral NPN bipolar transistor 108 includes a NPN base 116 between a NPN emitter 118 and a NPN collector 120. The NPN base 116 is a p-type semiconductor region and the NPN emitter 118 and the NPN collector 120 are heavily-doped n-type semiconductor regions separated by the NPN base 116. The lateral NPN bipolar transistor 108 also includes a NPN extrinsic base region 126 abutting the NPN base 116. The NPN extrinsic base region 126 is a heavily-doped p-type semiconductor region. Furthermore, the NPN base 116, the NPN emitter 118, and the NPN collector 120 abut the SOI buried oxide 104.

The inverter circuit 102 includes an input terminal 128 electrically coupled to the NPN extrinsic base region 126 and the PNP extrinsic base region 124. Additionally, an output terminal 130 is electrically coupled to the NPN collector 120 and the PNP collector 114. The inverter circuit 102 is powered with a power voltage line $V_{DD}$ electrically coupled to the PNP emitter 112 and a ground voltage line electrically coupled to the NPN emitter 118. The PNP base 110 and the NPN base 116 may be fabricated from silicon or silicon-germanium alloy.

Figure 2:
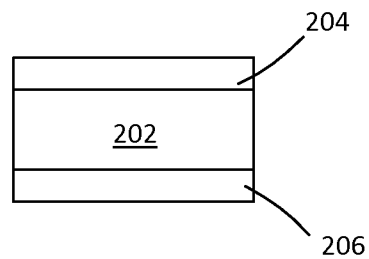
FIG. 2 shows an example of a PNP base and a NPN base with a middle region between a top region and a bottom region.

With reference to FIG. 2, the PNP base 110 and the NPN base 116 may include a middle region 202 between a top region 204 and a bottom region 206. The base is configured so that the middle region 202 has a smaller band gap than the top region 204 and the bottom region 206. For example, the middle region is made of silicon-germanium alloy and the top and the bottom regions are made of silicon. For a detailed discussion of a transistor base with a middle region 202 between a top region 204 and a bottom region 206, the reader is referred to U.S. patent application Ser. No. 12/958,647 filed Dec. 2, 2010, titled "SOI SiGe-BASE LATERAL BIPOLAR JUNCTION TRANSISTOR" and incorporated herein in its entirety by reference.

Referring to FIGS. 3A-3F, embodiments of the present invention include a method for fabricating a complementary transistor inverter circuit. The method includes fabricating a lateral PNP transistor on a silicon-on-insulator substrate, fabricating a lateral NPN transistor on the silicon-on-insulator substrate, and electrically coupling the lateral PNP transistor and the lateral NPN transistor to form an inverter.

Figure 3A:
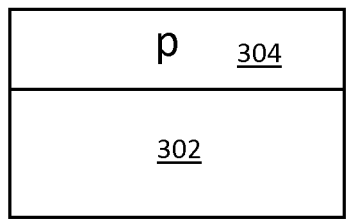
FIG. 3A illustrates providing a silicon-on-insulator (SOI) wafer as a starting substrate.

At FIG. 3A, the method includes providing a silicon-on-insulator (SOI) wafer as a starting substrate. The silicon layer 304 is located on the buried oxide 302 on a substrate which is not shown. The silicon thickness may be, for example, between 10 nm to 100 nm, and buried insulator thickness between 20 nm to 200 nm. Shallow trench isolation may be used to define active silicon device areas. This step may include removing a silicon layer between active silicon device areas, filling the trench with oxide and polishing the wafer to form a planar surface. At least one NPN transistor and PNP transistor device areas are defined during the trench isolation step.

Next, a masked implant step is used to dope the silicon p-type 304 to about $1\times10^{18}$ parts/cm$^3$ to $1\times10^{19}$/cm$^3$ in the NPN device areas. Another implanting step dopes the silicon n-type to about similar concentration in the PNP device areas.

Figure 3B:
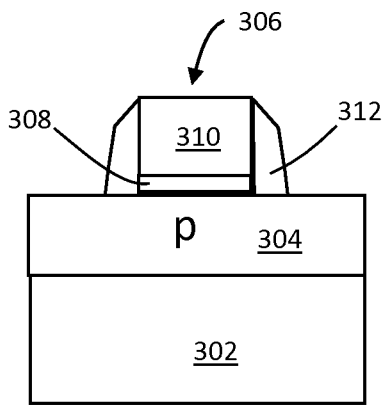
FIG. 3B illustrates forming a dummy gate stack.

Next, at FIG. 3B, a dummy gate stack 306 is formed (to be removed later). The dummy gate stack 306 includes a dielectric layer 308 and a polysilicon layer 310. The total gate stack height can be between 50 nm to 200 nm. The dummy gate stack can be taller than the silicon thickness to facilitate the self-aligned implant.

After creating the dummy gate stack 306, the polysilicon layer and the dielectric layer are etched selective to the underlying silicon layer 304. In addition, sidewall spacers 312 are formed by depositing a dielectric layer (e.g., nitride) followed by an etch back.

Figure 3C:
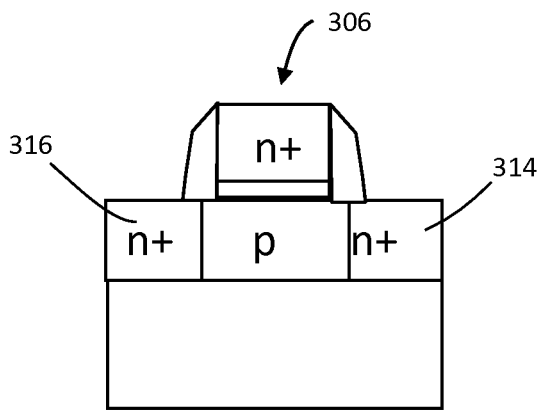
FIG. 3C illustrates performing a self-aligned implant to form heavily doped emitter and collector regions using a gate stack as an implant mask.

At FIG. 3C, a self-aligned implant is performed to form heavily doped emitter 314 and collector 316 regions using the gate stack 306 as an implant mask. The NPN transistor is doped n-type and the PNP transistor doped p-type. The doping concentration may be in the range of $5\times10^{19}$ parts/cm$^3$ to $5\times10^{20}$ parts/cm$^3$.

Figure 3D:
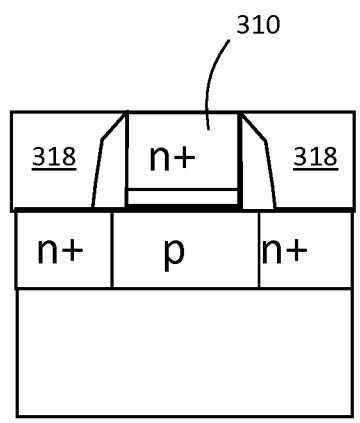
FIG. 3D illustrates depositing a dielectric layer.

Next, at FIG. 3D, a dielectric layer 318 (e.g., oxide) is deposited. This is followed by polish back to form a planar surface with the polysilicon layer 310 of the gate stack.

Figure 3E:
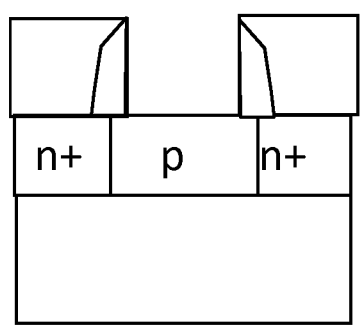
FIG. 3E illustrates removing the dummy gate stack.

At FIG. 3E, the dummy gate is removed. This process includes etching away the exposed polysilicon layer and then the underlying dielectric layer in both the NPN and PNP transistor device areas.

Figure 3F:
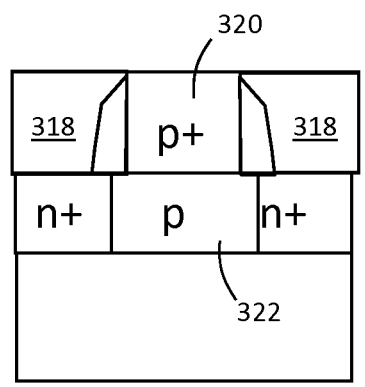
FIG. 3F illustrates refilling a gate trench with polysilicon.

At FIG. 3F, the gate trench is refilled with polysilicon 320. This step is followed by polish back to form a planar surface with the dielectric layer 318. The polysilicon layer 320 is doped by masked implant; p-type doping for the NPN transistor and n-type doping for the PNP transistor. The doped polysilicon layer 320 acts as the extrinsic base for contacting the intrinsic base layer 322 underneath.

The inverter fabrication undergoes further processing, such as removing the dielectric layer outside the gate material while keeping the spacer intact. The process may additionally add a spacer layer before a self-aligned silicidation process. Next, a self-aligned silicidation, metalization and contact process is performed to wire the NPN and PNP transistors to form the complementary lateral SOI bipolar inverter.

One advantage of the replacement gate process flow described above is that the sacrificial dielectric layer under the polysilicon gate is used as an etch stopper for the gate stack etch process to prevent any recess in the emitter and collector areas. Furthermore, the replacement gate process is generally compatible with the conventional CMOS fabrication process.

Alternatively, a "gate first" process flow can be used in which the polysilicon layer is deposited directly on the silicon layer without the gate dielectric layer in between. In this flow, no dummy gate removal and polysilicon gate refill is needed. However, the gate stack etch will also remove the top part of the silicon layer in the emitter and collector regions in absence of an etch stopper such as a dielectric layer.

As mentioned above, the transistor bases may be fabricated from a silicon-germanium alloy. FIGS. 4A-4G show an example method for fabricating a complementary transistor inverter circuit using a silicon-germanium alloy for the transistor bases.

Figure 4A:
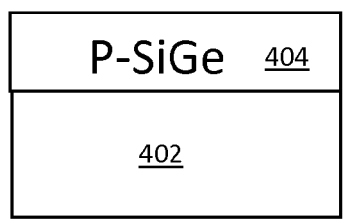
FIG. 4A illustrates a silicon-germanium-on-insulator (SGOI) wafer is provided as a starting substrate.
Figure 4B:
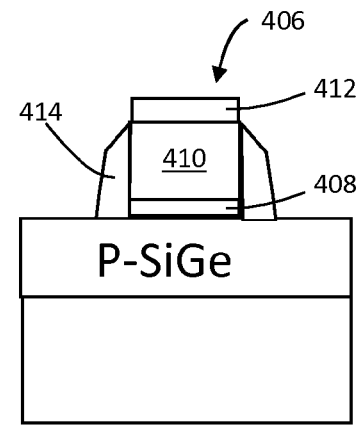
FIG. 4B illustrates forming a dummy gate stack.

At FIG. 4A, a silicon-germanium-on-insulator (SGOI) wafer is provided as a starting substrate. The silicon-germanium alloy layer 404 is located on the buried oxide 402 on a substrate, which is not shown. In one embodiment, the SiGe layer thickness is between 10 to 100 nm, and buried insulator thickness between 20 nm to 200 nm. The SGOI wafer can be formed by depositing a germanium layer on a SOI wafer followed by a thermal mixing process. The atomic germanium concentration can be approximately 10% to 50%.

The fabrication method may include performing a shallow trench isolation to define active device areas. This includes removing the silicon-germanium layer between active device areas, filling the trench with oxide and polishing back to form a planar surface. At least a NPN SiGe-base transistor and a PNP SiGe-base transistor device areas are defined during this step.

Next, a masked implant is used to dope the SiGe layer p-type 404. The doping may be about $1\times10^{18}$ parts/cm$^3$ to $1\times10^{19}$/cm$^3$ in the NPN device areas. Another implanting step dopes the SiGe layer n-type to about similar concentration in the PNP device areas Next, at FIG. 4B, a dummy gate stack 406 is formed (to be removed later). The dummy gate stack 406 includes a dielectric layer 408 (e.g., oxide), a polysilicon layer 410, and another dielectric layer 412 (e.g., nitride). The total gate stack height can be between 50 nm to 200 nm. The dummy gate stack can be taller than the SiGe layer thickness to facilitate the self-aligned implant.

After creating the dummy gate stack 406, the polysilicon layer and the dielectric layer are etched selective to the underlying silicon-germanium alloy layer 404. In addition, sidewall spacers 414 are formed by depositing a dielectric layer (e.g., nitride) followed by an etch back.

Figure 4C:
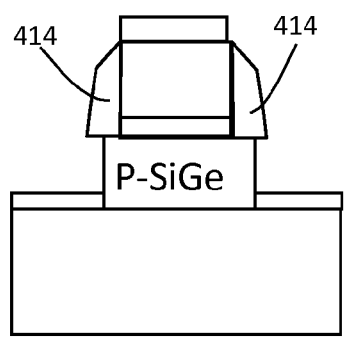
FIG. 4C illustrates recessing a SiGe layer in emitter and collector areas.

As shown in FIG. 4C, the SiGe layer is recessed in the emitter and collector areas. This leaves a 10 nm to 20 nm seed layer for subsequent epitaxial silicon growth.

Figure 4D:
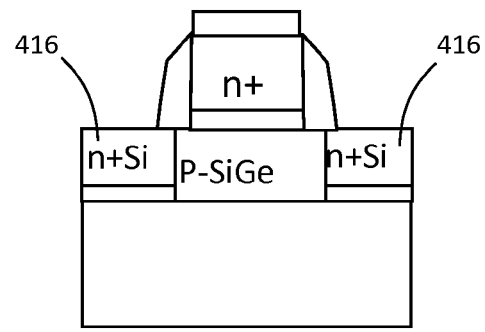
FIG. 4D illustrates selectively growing an epitaxy silicon layer in emitter and collector areas.

Next, at FIG. 4D, an epitaxy silicon layer 416 is selectively grown in the emitter and collector areas. The silicon layer 416 can be in-situ doped to n-type in the NPN transistor and p-type in the PNP transistor. Alternatively, the silicon layer 416 can be doped by self-aligned implant similarly to those in a Si-based bipolar inverter. With the in-situ doped process, a dielectric layer is needed to protect the PNP device region when the n-doped silicon is grown over the NPN transistor area, and vise versa. The doping concentration is in the range of $5 \times 10^{19}$ parts/cm$^3$ to $5 \times 10^{20}$ parts/cm$^3$.

Figure 4E:
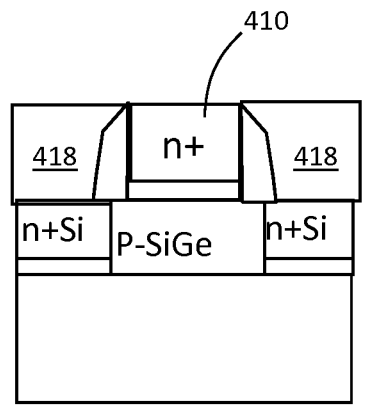
FIG. 4E illustrates depositing a dielectric layer.

Next, at FIG. 4E, a dielectric layer 418 (e.g., oxide) is deposited. This is followed by polish back to form a planar surface with the polysilicon layer 410 of the gate stack.

Figure 4F:
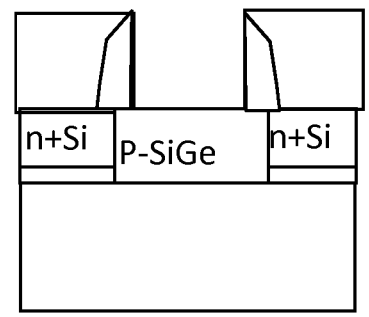
FIG. 4F illustrates removing the dummy gate stack.

At FIG. 4F, the dummy gate is removed. This process includes etching away the exposed polysilicon layer and then the underlying dielectric layer in both the NPN and PNP transistor device areas.

Figure 4G:
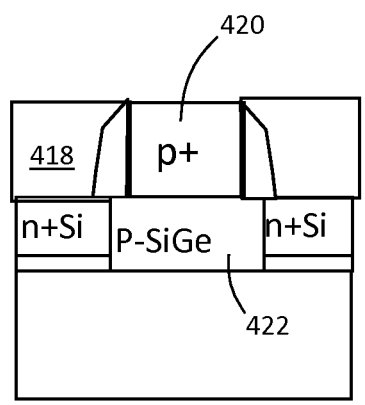
FIG. 4G illustrates refilling a gate trench with polysilicon.

At FIG. 4G, the gate trench is refilled with polysilicon 420. This step is followed by polish back to form a planar surface with the dielectric layer 418. The polysilicon layer 420 is doped by masked implant; p-type doping for the NPN transistor and n-type doping for the PNP transistor. The doped polysilicon layer 420 acts as the extrinsic base for contacting the intrinsic base layer 422 underneath.

The inverter fabrication undergoes further processing, such as removing the dielectric layer outside the gate material while keeping the spacer intact. The process may additionally add a spacer layer before a self-aligned silicidation process. Next, a self-aligned silicidation process followed by metalization and contact processes are performed to wire the NPN and PNP transistors to form the complementary SiGe-base lateral SOI bipolar inverter.

Figure 5:
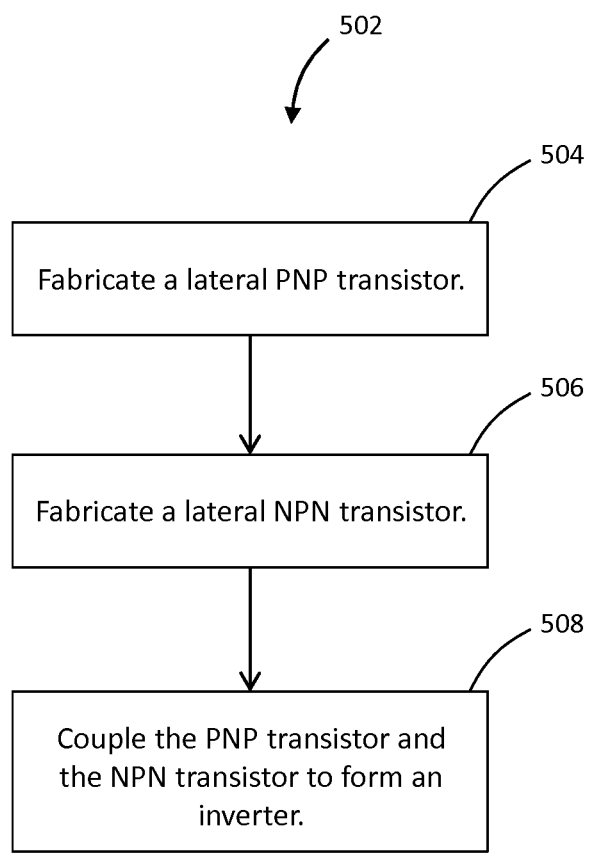
FIG. 5 shows a flowchart representing an example method for fabricating complementary transistor inverter circuit contemplated by the present invention.

FIG. 5 shows a flowchart representing an example method 502 for fabricating a complementary transistor inverter circuit contemplated by the present invention.

The method includes fabricating operation 504, where a lateral PNP transistor is formed on a semiconductor-on-insulator (SOI) substrate. The method also includes fabricating operation 506, where a lateral NPN transistor is formed on the semiconductor-on-insulator substrate. Next, coupling operation 508 electrically couples the lateral PNP transistor and the lateral NPN transistor to form an inverter.

As discussed above, the lateral PNP bipolar transistor includes a PNP base, a PNP emitter, and a PNP collector. The PNP base, PNP emitter, and PNP collector abut the buried insulator of the SOI substrate. Furthermore, the lateral NPN bipolar transistor includes a NPN base, a NPN emitter, and a NPN collector. The NPN base, NPN emitter, and NPN collector also abut the buried insulator of the SOI substrate. Additionally, coupling operation 508 may include electrically coupling the PNP base to the NPN base and electrically coupling the PNP collector to the NPN collector. The NPN base and the PNP base may be fabricated from silicon or silicon-germanium alloy. The buried insulator may be oxide.

Fabricating operation 504 may include doping a PNP region of the semiconductor-on-insulator substrate with n-type dopant to form a n-type region. A dummy stack is then formed over the PNP base and p-type dopant is implanted using the dummy stack as a mask to form a heavily-doped p-type emitter region and a heavily-doped p-type collector region. Next, the dummy stack is removed and replaced with a PNP extrinsic base region abutting the PNP base. As detailed above, the dummy stack can include a dielectric oxide layer and a semiconductor layer over the dielectric oxide layer. The PNP extrinsic base region can be a heavily-doped n-type semiconductor region. Fabrication operation 504 may also include forming dielectric side wall spacers along two sides of the PNP dummy stack.

Fabricating operation 506 may include doping a NPN region of the semiconductor-on-insulator substrate with p-type dopant to form a p-type region. A dummy stack is then formed over the NPN base and n-type dopant is implanted using the dummy stack as a mask to form heavily-doped n-type emitter and collector regions. Next, the dummy stack is removed and replaced with a NPN extrinsic base region abutting the NPN base. In this case, the dummy stack includes a dielectric oxide layer and a semiconductor layer over the dielectric oxide layer. The NPN extrinsic base region can be a heavily-doped p-type semiconductor region. Fabrication operation 506 may also include forming dielectric side wall spacers along two sides of the NPN dummy stack.

The method 502 may include forming an isolation trench between a PNP region containing the lateral PNP transistor and a NPN region containing the lateral NPN transistor. The isolation trench is then filled with a dielectric material.

Having described embodiments for the invention (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A complementary transistor inverter circuit comprising:
   a semiconductor-on-insulator (SOI) substrate;
   a lateral PNP bipolar transistor fabricated on the SOI substrate, the lateral PNP bipolar transistor including a PNP base, a PNP emitter, and a PNP collector; and
   a lateral NPN bipolar transistor fabricated on the SOI substrate, the lateral NPN bipolar transistor including a NPN base, a NPN emitter, and a NPN collector;
   an output terminal electrically coupled to the NPN collector and the PNP collector;
   a ground voltage line electrically coupled to the NPN emitter;
   a power voltage line electrically coupled to the PNP emitter; and
   a NPN extrinsic base region abutting the NPN base, the NPN extrinsic base region being a heavily-doped p-type semiconductor region; and
   wherein the NPN base is a p-type semiconductor region;
   wherein the NPN emitter and the NPN collector are heavily-doped n-type semiconductor regions separated by the NPN base; and
   wherein the NPN base, the NPN emitter, and the NPN collector abut a buried insulator of the SOI substrate.

2. A complementary transistor inverter circuit comprising:
   a semiconductor-on-insulator (SOI) substrate;
   a lateral PNP bipolar transistor fabricated on the SOI substrate, the lateral PNP bipolar transistor including a PNP base, a PNP emitter, and a PNP collector; and
   a lateral NPN bipolar transistor fabricated on the SOI substrate, the lateral NPN bipolar transistor including a NPN base, a NPN emitter, and a NPN collector;
   an output terminal electrically coupled to the NPN collector and the PNP collector;

a ground voltage line electrically coupled to the NPN emitter;

a power voltage line electrically coupled to the PNP emitter;

a PNP extrinsic base region abutting the PNP base, the PNP extrinsic base region being a heavily-doped n-type semiconductor region; and wherein the PNP base is a n-type semiconductor region;

wherein the PNP emitter and the PNP collector are heavily-doped p-type semiconductor regions separated by the PNP base; and wherein the PNP base, the PNP emitter, and the PNP collector abut a buried insulator of the SOI substrate.

3. A complementary transistor inverter circuit comprising:
a semiconductor-on-insulator (SOI) substrate;
a lateral PNP bipolar transistor fabricated on the SOI substrate, the lateral PNP bipolar transistor including a PNP base, a PNP emitter, and a PNP collector;
a lateral NPN bipolar transistor fabricated on the SOI substrate, the lateral NPN bipolar transistor including a NPN base, a NPN emitter, and a NPN collector;
an output terminal electrically coupled to the NPN collector and the PNP collector;
a ground voltage line electrically coupled to the NPN emitter;
a power voltage line electrically coupled to the PNP emitter;
a NPN extrinsic base region abutting the NPN base, the NPN extrinsic base region being a heavily-doped p-type semiconductor region;
a PNP extrinsic base region abutting the PNP base, the PNP extrinsic base region being a heavily-doped n-type semiconductor region; and
an input terminal electrically coupled to the NPN extrinsic base region and the PNP extrinsic base region.

4. The complementary transistor inverter circuit of claim 1, wherein the NPN base is fabricated from one of silicon and silicon-germanium alloy.

5. The complementary transistor inverter circuit of claim 1, wherein the PNP base is fabricated from one of silicon and silicon-germanium alloy.

6. The complementary transistor inverter circuit of claim 1, further comprising:
wherein the PNP base includes a first middle region between a first top region and a first bottom region, the first middle region having a smaller band gap than the first top region and the first bottom region; and
wherein the NPN base includes a second middle region between a second top region and a second bottom region, the second middle region having a smaller band gap than the second top region and the second bottom region.

7. A method for fabricating a complementary transistor inverter circuit, the method comprising:
fabricating a lateral PNP transistor on a semiconductor-on-insulator substrate, the lateral PNP bipolar transistor including a PNP base, a PNP emitter, and a PNP collector;
fabricating a lateral NPN transistor on the semiconductor-on-insulator substrate, the lateral NPN bipolar transistor including a NPN base, a NPN emitter, and a NPN collector;
electrically coupling the lateral PNP transistor and the lateral NPN transistor to form an inverter;
forming an isolation trench between a PNP region containing the lateral PNP transistor and a NPN region containing the lateral NPN transistor;
filling the isolation trench with a dielectric material;
doping a PNP region of the semiconductor-on-insulator substrate with n-type dopant to form a n-type region;
forming a PNP dummy stack over the PNP region, the dummy stack including a dielectric layer and a semiconductor layer over the dielectric layer;
implanting p-type material using the dummy stack as a mask to form a heavily-doped p-type emitter region and a heavily-doped p-type collector region;
removing the PNP dummy stack; and
replacing the dummy stack with a PNP extrinsic base region abutting the n-type region, the PNP extrinsic base region being a heavily-doped n-type semiconductor region.

8. The method of claim 7, wherein fabricating the lateral PNP transistor includes:
forming a dummy stack over the PNP base, the dummy stack including a dielectric layer and a semiconductor layer over the dielectric layer;
removing the dummy stack; and
replacing the dummy stack with a PNP extrinsic base region abutting the PNP base, the PNP extrinsic base region being a heavily-doped n-type semiconductor region.

9. The method of claim 7, wherein fabricating the lateral NPN transistor includes:
forming a dummy stack over the NPN base, the dummy stack including a dielectric layer and a semiconductor layer over the dielectric layer;
removing the dummy stack; and
replacing the dummy stack with a NPN extrinsic base region abutting the NPN base, the NPN extrinsic base region being a heavily-doped p-type semiconductor region.

10. The method of claim 9, further comprising forming dielectric side wall spacers along two sides of the PNP dummy stack.

11. A method for fabricating a complementary transistor inverter circuit, the method comprising:
fabricating a lateral PNP transistor on a semiconductor-on-insulator substrate, the lateral PNP bipolar transistor including a PNP base, a PNP emitter, and a PNP collector;
fabricating a lateral NPN transistor on the semiconductor-on-insulator substrate, the lateral NPN bipolar transistor including a NPN base, a NPN emitter, and a NPN collector;
electrically coupling the lateral PNP transistor and the lateral NPN transistor to form an inverter;
doping a NPN region of the semiconductor-on-insulator substrate with p-type dopant to form a p-type region;
forming a NPN dummy stack over the NPN region, the dummy stack including a dielectric layer and a semiconductor layer over the dielectric layer;
implanting n-type material using the dummy stack as a mask to form a heavily-doped n-type emitter region and a heavily-doped n-type collector region;
removing the NPN dummy stack; and
replacing the dummy stack with a NPN extrinsic base region abutting the p-type region, the NPN extrinsic base region being a heavily-doped p-type semiconductor region.

12. The method of claim 11, further comprising forming dielectric side wall spacers along two sides of the NPN dummy stack.

13. The method of claim 7, wherein electrically coupling the lateral PNP transistor and the lateral NPN transistor includes:
   electrically coupling the PNP base to the NPN base; and
   electrically coupling the PNP collector to the NPN collector.

14. The method of claim 7, wherein the NPN base and the PNP base are fabricated from one of silicon and silicon-germanium alloy.

15. The method of claim 7, wherein the PNP base, the PNP emitter, the PNP collector, the NPN base, the NPN emitter, and the NPN collector abut the buried insulator of the SOI substrate.

\* \* \* \* \*